United States Patent [19]

Hall et al.

[11] Patent Number: 5,457,149

[45] Date of Patent: Oct. 10, 1995

[54] REWORKABLE ADHESIVE FOR ELECTRONIC APPLICATIONS

[75] Inventors: Joyce B. Hall; Peter B. Hogerton; Jean-Marc Pujol, all of St. Paul, Minn.

[73] Assignee: Minnesota Mining and Manufacturing Company, St. Paul, Minn.

[21] Appl. No.: 166,271

[22] Filed: Dec. 13, 1993

Related U.S. Application Data

[63] Continuation of Ser. No. 816,854, Jan. 2, 1992, abandoned, which is a continuation of Ser. No. 535,364, Jun. 8, 1990, abandoned.

[51] Int. Cl.$^6$ .................... C08L 81/06; C08L 29/14; C08L 63/02

[52] U.S. Cl. .................... 25/523; 525/58; 525/107; 525/113; 525/403; 525/407; 525/410; 525/420; 525/423; 525/437; 525/438; 525/463; 525/467; 525/504; 525/507; 525/534

[58] Field of Search .................... 525/523, 534, 525/58, 107, 113, 403, 407, 410, 420, 423, 437, 438, 463, 467, 504, 507

[56] References Cited

U.S. PATENT DOCUMENTS

| | | | |
|---|---|---|---|
| 3,530,087 | 9/1970 | Hayes et al. | 260/37 |
| 3,595,000 | 7/1971 | Recker | 56/328 |
| 3,678,131 | 7/1972 | Klapprott et al. | 260/837 R |
| 3,733,349 | 5/1973 | Loudas et al. | 260/453 |
| 3,798,105 | 3/1974 | Hanna et al. | 156/307 |
| 3,962,184 | 6/1976 | Notomi et al. | 260/47 |
| 4,022,755 | 5/1977 | Tanigaichi et al. | 260/59 |
| 4,026,913 | 5/1977 | Tanigaichi et al. | 260/463 |
| 4,116,946 | 9/1978 | Jakob et al. | 528/172 |
| 4,195,132 | 3/1980 | Sundermann et al. | 521/155 |
| 4,331,582 | 5/1982 | Babayan | 523/453 |
| 4,414,366 | 11/1983 | Wu et al. | 525/439 |
| 4,503,211 | 3/1985 | Robins | 528/92 |
| 4,528,366 | 7/1985 | Woo et al. | 528/422 |
| 4,606,962 | 8/1986 | Reylek et al. | 428/148 |
| 4,645,805 | 2/1987 | Gaku et al. | 525/176 |
| 4,661,559 | 4/1987 | Gardner et al. | 525/534 |
| 4,677,144 | 6/1987 | Yasuda et al. | 523/456 |
| 4,680,226 | 7/1987 | Takeda | 428/327 |
| 4,684,678 | 8/1987 | Schultz et al. | 525/423 |
| 4,693,770 | 9/1987 | Hatada | 156/151 |
| 4,696,764 | 9/1987 | Yamazaki | 524/439 |
| 4,707,534 | 11/1987 | Schultz | 528/97 |
| 4,709,008 | 11/1987 | Shimp | 528/422 |
| 4,717,609 | 1/1988 | Gaku et al. | 525/437 |
| 4,735,847 | 4/1988 | Fujiwara et al. | 428/209 |
| 4,739,019 | 4/1988 | Schappert et al. | 525/438 |
| 4,740,584 | 4/1988 | Shimp | 528/422 |
| 4,749,120 | 6/1988 | Hatada | 156/295 |
| 4,759,970 | 7/1988 | Seeger, Jr. et al. | 428/209 |
| 4,769,399 | 9/1988 | Schenz | 523/213 |
| 4,804,740 | 2/1989 | Gardner et al. | 524/612 |
| 4,814,040 | 3/1989 | Ozawa | 156/634 |
| 4,820,446 | 4/1989 | Prud'Homme | 252/511 |
| 4,822,683 | 4/1989 | Schappert et al. | 428/414 |
| 4,868,288 | 9/1989 | Meier | 534/15 |
| 4,902,752 | 2/1990 | Shimp | 525/534 |
| 5,002,818 | 3/1991 | Licari et al. | 525/530 |

FOREIGN PATENT DOCUMENTS

| | | |
|---|---|---|
| 0265077A2 | 4/1988 | European Pat. Off. . |
| 326931 | 8/1989 | European Pat. Off. . |
| 0326931 | 8/1989 | European Pat. Off. ............... 525/534 |
| 2095359 | 6/1971 | France . |
| 113480 | 5/1989 | Japan . |
| 113479 | 5/1989 | Japan . |
| 1169613 | 11/1969 | United Kingdom ................... 525/534 |

OTHER PUBLICATIONS

Kirk–Othmer, *Encyclopedia of Chemical Technology*, vol. 18 pp. 605–610.

Raghava, "Role of Matrix–Particle Interface Adhesion on Fracture Toughness of Dual Phase Epoxy–Polyethersulfone Blend", Journal of Polymer Science/Part B: Polymer Physics, vol. 25, May 1987.

E. Grigat et al., *Agnew. Chem. Internat. Edit.*, 6, 206 (1967).

F. A. Hudock et al., technical paper presented at the IPC Fall Meeting Sep. 21–25, 1986.

K. Hatada, et al., *Proceedings of the 5th IEEE/CHMT International Electronic Manufacturing Technology Symposium—Design-to-Manufacturing Transfer Cycle*, Oct. 10–12, 1988, pp. 23–27, "Micron Bump Bonding Assembly Technology".

"AroCy™ B–40S Cyanate Ester Resin Solution" product brochure, Oct. 1988.

"AroCy™ T–30 Cyanate Ester Semisolid Resin" technical information brochure, Oct. 1988.

"RTX 366 Developmental Cyanate Ester Monomer" technical brochure.

"AcroCy™ M–30 Cyanate Ester Semisolid Resin" technical information brochure.

M. Masuda, et al., *Proceedings of the 1989 Japan IEMT Symposium, 6th IEEE/CHMT International Electronic Manufacturing Technology Symposium*, Apr. 26–28, 1989, pp. 55–58, entitled "Chip on Glass Technology for Large Capacity and High Resolution LCD".

K. K. T. Chumg, et al., *Connection Technology* Nov. 1989, pp. 37–39.

M. F. Hawthorne, *J. Org. Chem.*, 22, 1001 (1957).

D. Martin and M. Bauer, *Org. Synth.*, 61, 35–38 (1983).

W. E. Parham and E. L. Anderson, *J. Am Chem. Soc.*, 70, 4187 (1948).

J. Cromyn, *Structural Adhesives*, edited by A. J. Kinloch (Elsevier Applied Science Publishers, 1986), pp. 269–312.

U.S.Ser. No. 234,464, "Energy–Curable Cyanate Compositions", filed Aug. 19, 1988.

R. R. Tummala and E. J. Rymaszewski, *Microelectronics Packaging Handbook*, (Van Nostrand Reinhold, 1989), pp.

(List continued on next page.)

Primary Examiner—Robert E. Sellers
Attorney, Agent, or Firm—Merchant, Gould, Smith, Edell, Welter & Schmidt

[57] ABSTRACT

Reworkable adhesive that has a high shear strength through a range of use temperatures but which has a low strength and is reworkable at a suitable processing temperature.

10 Claims, 6 Drawing Sheets

OTHER PUBLICATIONS

280–309; 366–391.

K. Nakamura, *Nikkei Microdevices*, Jun. 1987.

R. S. Bauer, "Toughened High Performance Epoxy Resins: Modification with Thermoplastics", 34th International SAMPE Symposium, May 8–11, 1989.

P. B. Hogerton, et al., "Investigations Into the Use of Adhesives for Level-1 Microelectronic Interconnections", Electronic Packaging Materials Science, Symposium Proceedings, Apr. 24≧29, 1989.

REWORKABLE ADHESIVE FOR ELECTRONIC APPLICATIONS

This is a continuation of application Ser. No. 07/816,854, filed Jan. 2, 1992, which was a continuation of prior application Ser. No. 07/535,364, filed on Jun. 8, 1990, both now abandoned.

FIELD OF INVENTION

The present invention relates to an adhesive composition, and particularly to an adhesive composition that is reworkable or repairable in use with an integrated circuit, rigid circuit, or flexible circuit.

BACKGROUND ART

Electronic devices, such as calculators, watches, portable computer terminals, and "smart" cards, utilize a wide variety of integrated circuits, rigid circuits, and flexible circuits. In such devices, there are a number of means used for attaching and providing electrical connection between a circuit and a conductive substrate. The means for providing attachment and electrical connection include metallic solders and adhesive compositions, including conductive adhesive compositions.

Conductive adhesives may contain sparse and randomly dispersed populations of fine conductive particles. The particles provide electrical conductivity through the thickness of the adhesive, but not in the plane of the adhesive film. Such adhesives are sometimes provided as an adhesive film, often referred to as Z-axis films (ZAF).

Adhesives that are used in known Z-axis adhesive films typically have glass transition temperatures ($T_g$) of less than about 50° C., and are usually soft, rubbery, thermoplastic materials having little or no crosslinking. The use of such an adhesive permits rapid bonding, at a modest temperature, with ease of repairability.

A repairable, or reworkable, adhesive is an adhesive that can be entirely removed from the bonded device with heat and/or solvent. The use of a reworkable adhesive allows for the bonded device to be removed and repositioned without damage to the device, e.g., a printed circuit or glass display. Displays or boards containing more than one chip are expensive. If one chip is defective, it is highly desirable to be able to replace it.

A deficiency in soft, rubbery, thermoplastic adhesives used for electrical connection is that they typically have poor creep resistance at high stress and/or temperature. Accordingly, such adhesives are useful only in applications involving limited stress. Thus, such adhesives are almost exclusively used for the bonding of lightweight, flexible circuits to other components, an application with relatively minimal stress. An example of such a thermoplastic adhesive for use as a repairable adhesive film in electronic applications is disclosed in U.S. Pat. No. 4,820,446 (Prud'Homme).

While certain highly crosslinked or thermoset adhesive systems perform adequately in high stress applications, these adhesives are deficient in that they are not reworkable. An example of such a non-reworkable adhesive composition, exhibiting superior shear strengths at high temperatures, is disclosed in U.S. Pat. No. 4,769,399 (Schenz).

An application in the electronic industry with particularly demanding performance requirements has arisen, at least in part, from the demand for increased power to size ratio in electronic products, and the resultant need for higher input/output (I/O) counts and I/O densities between components. In addition, the demand for higher information flow rates has necessitated higher signal frequencies. To accommodate these needs, Flipped Direct Chip Attachment (FDCA) is used to attach a chip directly to a circuit board, and provide the shortest attainable path length between components, thus minimizing signal propagation delays at high frequency.

The most common attachment means used in FDCA is solder bump/flip-chip interconnection. With this approach, metallurgical solder joints provide both the mechanical and electrical interconnections between the chip and the substrate. This method has inherent pitch limitations and also is susceptible to mismatches between the coefficients of thermal expansion (CTE) of the chip and the substrate. Substantial CTE mismatch between these materials results in high shear stresses in the solder joints which can compromise the reliability of the interconnections. See, R. R. Tummala and E. J. Rymaszewski, *Microelectronics Packaging Handbook*, (Van Nostrand Reinhold, 1989) pp. 280–309; 366–391; and K. Nakamura, *Nikkei Microdevices*, June 1987. Catastrophic failure is the immediate result of any cracking that occurs in these solder joints as a reaction to these stresses.

Because of the inherent deficiencies with solder bump bonding, an alternate means of interconnection for FDCA and other applications is highly desirable. One method involves the use of a heat-bondable adhesive, which may or may not be curable, to provide an intimate mechanical flip-chip bond, and to provide pressure engaged, rather than metallurgical, electrical interconnections to the substrate. Conductive particles within the adhesive or, alternately, metallic bumps on the chip itself, provide the electrical interconnection media for this method. Thermal and/or cure shrinkage stresses in the adhesive can be used to provide the compressive forces on the interconnection media that are needed in order to establish the pressure engaged contacts. In order to permit the buildup of contacting forces on the interconnection media, it is necessary that the interconnection media remain in the solid state during the bonding operation.

Pressure engaged interconnections are more able to accommodate shear stresses than are solder joints. Also, the presence of an adhesive at the bond line will tend to dramatically reduce the magnitude of the shear stresses at the contact sites. Therefore, CTE mismatches are better accommodated by FDCA with adhesives than by solder bump bonding.

Another potential advantage of FDCA with adhesives arises from the fact that the interconnection media (i.e., conductive particles in the adhesive or metallic bumps on the chip) do not melt during the bonding process, as does, for example, solder. It is much easier to control pad-to-pad spacing when the conductive structures in the bond line remain in the solid state during processing. Because of this, FDCA with adhesives provides the potential for reduced, and also more precise, spacing between interconnections as compared to solder bump bonding.

An important obstacle preventing the use of adhesives for FDCA has been the lack of an adhesive that has adequate creep resistance at elevated temperature and stress to provide stable interconnections and that also provides ease of handling and repairability. After bonding, the adhesive layer is highly stressed in tension. In order to provide a stable interconnection, the adhesive layer must be able to sustain this internal stress without creeping or fracturing. The high stress is the result of: a) the adhesive layer being as much as twenty times thinner than either a silicon chip or a rigid printed circuit board; and b) the very high CTE and very low elastic modulus of adhesives relative to either of these substrates.

The magnitude of the tensile stress in the adhesive layer is sufficiently high that known thermoplastic resins that are heat processable at temperatures of less than 200° C. are unable to provide stable interconnections over the required range of operating temperatures. Highly crosslinked thermoset resins can be found that will provide stable interconnections at these high stresses and temperatures, but those materials are not reworkable with non-destructive methods.

In addition to the thermoplastic and thermoset adhesive systems, thermoplastic/thermoset blends are of possible interest for electrical interconnections. Such mixtures have been designed to improve high temperature performance of the thermoset materials, and/or to improve the fracture toughness of the thermoset material. See, U.S. Pat. No. 3,530,087 (Hayes et al.); and R. S. Bauer, *Toughened High Performance Epoxy Resins: Modifications with Thermoplastics*, 34th International SAMPE Symposium, May 8–11, 1989.

However, despite the prior uses of thermoplastic adhesives, thermoset adhesives, and mixtures thereof, presently known interconnect means for demanding applications, such as FDCA, have failed to adequately solve the problems set forth above. Accordingly, there remains a need for a reworkable adhesive material that permits rapid bonding at a modest temperature and that also has a modulus sufficient to withstand significant stress and/or high temperatures, at least through the range of use temperatures. The adhesive should also be reworkable at a processing temperature, $T_p$, that is sufficiently low so that the substrate is not damaged during removal of a chip. There is also a need for such an adhesive that has an extended shelf life at room temperature, has a low viscosity at the intended bonding temperature to provide good flow properties, is resistant to conditions of up to 85° C. and 85 percent relative humidity, is resistant to higher qualifying temperatures, and may be provided as a film that is substantially tackfree at the intended handling temperature.

DISCLOSURE OF THE INVENTION

The present invention provides a reworkable adhesive film that permits rapid bonding at modest temperatures, while having sufficient storage modulus at low frequencies, such as 1 hertz, (hereinafter "modulus") to provide significant contacting forces over the range of temperatures useful in electronic applications. The adhesive provides a sufficient modulus through a range of use temperatures, but is also reworkable at a suitable processing temperature. The present invention also provides such a reworkable adhesive that has an extended shelf life at room temperature, has a low viscosity at the intended bonding temperature and pressure to provide good flow properties, is resistant to conditions of up to 85° C. and 85 percent relative humidity, is resistant to conditions up to higher qualifying temperatures (defined below), and may be provided as an adhesive film that is substantially tackfree at typical handling temperatures.

The present invention provides a reworkable adhesive composition, preferably provided as a nontacky or slightly tacky adhesive film, comprising the reaction product of: a) an effective amount of a thermoplastic polymer, having a $T_g$ of about 30° C. to 250° C., and b) an effective amount of a crosslinkable resin.

The cured adhesive composition has a shear strength of less than about 1 megaPascals ("MPa"), preferably less than about 0.5 MPa, at a temperature of about 20° C. above the $T_g$ of the cured adhesive composition. The adhesive composition preferably has such a shear strength at the processing temperature, $T_p$, of the cured adhesive composition. $T_p$ is typically in the range of about 125° C. to 250° C., and preferably in the range of about 150° C. to 200° C.

The cured adhesive composition has a modulus of greater than about $1 \times 10^2$ MPa, preferably greater than about $1 \times 10^2$ MPa, at a temperature of about 20° C. below the $T_g$ of the cured adhesive composition. The adhesive composition preferably has such a modulus at the qualifying temperature, $T_Q$, of the adhesive composition. $T_Q$ is typically in the range of about 80° C. to 150° C., and preferably in the range of about 100° C. to 125° C. $T_Q$ is less than $T_p$.

The crosslinkable resin preferably has a $T_g$ of about 125° C. to 300° C. The cured adhesive composition preferably has a $T_g$ of about 100° C. to 200° C.

Where a $T_g$ value is given for a crosslinkable resin or adhesive composition it refers to the $T_g$ of the material in its polymeric or crosslinked form. As the material may comprise one or more crosslinkable and noncrosslinkable moieties, the material, from which $T_g$ is reported, may be a homo-, co-, ter-, or oligopolymer. Some materials may demonstrate more than one $T_g$. In such a case, $T_g$ will refer to the higher or highest of the $T_g$ values for the material.

The crosslinkable resin preferably comprises an epoxy resin or a cyanate ester resin. The epoxy resin preferably comprises an aromatic epoxy, and may also include an epoxy curative. The epoxy resin may typically comprise one or more components individually having a molecular weight of about 200 to 2000. The cyanate ester resin may typically include one or more components individually having a molecular weight of about 150 to 2000.

The epoxy resin preferably includes one or more epoxy compositions according to Formulas I, II, and/or III below:

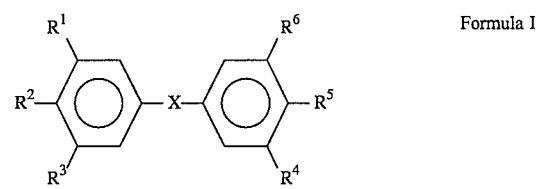

Formula I where X is a single bond, a $C_1$–$C_4$ alkylene group, or the "—$SO_2$— group":

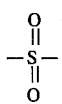

"alkylene or alkyl groups", as used herein, includes substituted alkylene or alkyl groups, such as halogenated alkylenes or alkyls (e.g., fluorinated alkylenes or alkyls); X is preferably a single bond, —$CH_2$—, —$C(CH_3)_2$—, or the —$SO_2$— group; and $R^1$, $R^2$, $R^3$, $R^4$, $R^5$, $R^6$ are each independently —H, a $C_1$–$C_5$ alkyl group, or the "Epoxy Group":

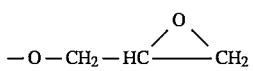

with at least two of $R^1$–$R^6$ being the Epoxy Group; preferably $R^2$ and $R^5$ are both the Epoxy Group, and $R^1$, $R^3$, $R^4$, $R^6$, are independently —H, or —$CH_3$;

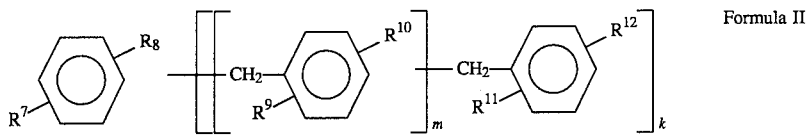

Formula II where $R^7$, $R^8$, $R^9$, $R^{10}$, $R^{11}$, $R^{12}$ are independently —H, a $C_1$–$C_5$ alkyl group, or the Epoxy Group, and k is 0 or 1, m is 0 to 9, with at least two of $R^7$–$R^{12}$ being the Epoxy Group, except when k is 0, wherein both $R^7$, $R^8$ are the Epoxy Group. $R^7$–$R^{12}$ are preferably independently —H, —CH$_3$, or the Epoxy Group, with at least two of $R^7$–$R^{12}$ being the Epoxy Group; and

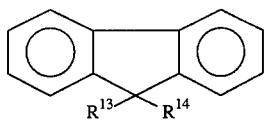

Formula III where $R^{13}$, $R^{14}$ are independently

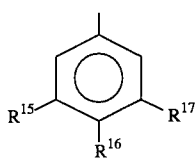

where $R^{15}$, $R^{16}$, $R^{17}$ are independently —H, a $C_1$–$C_5$ alkyl group, or the Epoxy Group, preferably —H, —CH$_3$, or the Epoxy Group, where $R^{13}$, $R^{14}$ combined include two or more Epoxy Groups; $R^{15}$–$R^{17}$ may be different for $R^{13}$ and $R^{14}$.

The epoxy curative is preferably a fluorene curative according to Formula III, except that one of $R^{15}$–$R^{17}$ is —NH$_2$, or —NHCH$_3$, and the other two of $R^{15}$–$R^{17}$ are independently —H, or a $C_1$–$C_3$ alkyl group; $R^{15}$–$R^{17}$ may be different for $R^{13}$ and $R^{14}$.

The cyanate ester resin preferably includes one or more cyanate ester compositions according to Formulas IV, V and/or VI below:

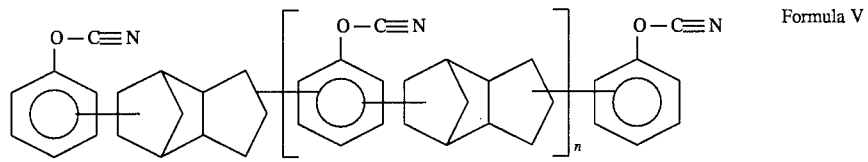

Formula IV where Y is a single bond, a $C_1$–$C_4$ alkylene group, —S—, or the —SO$_2$— group; and where $R^{18}$–$R^{23}$ are independently —H, a $C_1$–$C_5$ alkyl group, or the Cyanate Ester Group:

—OC≡N with at least two of $R^{18}$–$R^{23}$ being the Cyanate Ester Group. $R^{18}$–$R^{23}$ are preferably —H, —CH$_3$, or the Cyanate Ester Group;

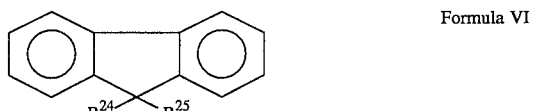

Formula V where n is 0 to 5; and

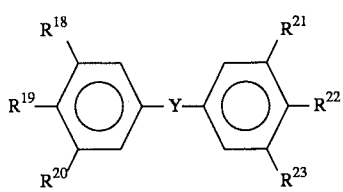

Formula VI where $R^{24}$, $R^{25}$ are independently

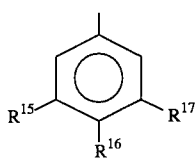

where $R^{26}$, $R^{27}$, $R^{28}$ are independently —H, a $C_1$–$C_5$ alkyl group, or the Cyanate Ester Group, preferably —H, —CH$_3$, or the Cyanate Ester Group, where $R^{24}$, $R^{25}$ combined include two or more Cyanate Ester Groups. $R^{26}$–$R^{28}$ may be different for $R^{24}$ and $R^{25}$.

The thermoplastic polymer preferably has a molecular weight of about 3,000 to 200,000. Lower molecular weights are preferable to promote resin flow at the bonding temperature. The thermoplastic polymer is preferably selected from the group consisting of polysulfones, polyvinyl acetals, polyamides, polyimides, polyesters, polyetherimides, polycarbonates, polyethers, and polyvinyls.

The present invention also provides a method for forming a reworkable adhesive bond between two conductive surfaces to form a conductive bonded composite. The method comprises the steps of: providing a reworkable adhesive film of the present invention; providing a conductive substrate having one or more conductive bonding sites; providing one or more conductive devices, each having a conductive bonding surface; positioning the reworkable adhesive between each of the conductive bonding sites and each of the conductive devices; and applying sufficient heat and/or pressure, for a sufficient time, to form a reworkable adhesive bond between each conductive bonding site and each conductive device. Each of the reworkable adhesive bonds has a shear strength of less than about 1 MPa at a temperature of about 20° C. above the $T_g$ of the cured reworkable adhesive film, and preferably at $T_p$ of the adhesive composition. The reworkable adhesive has a modulus of greater than about $1 \times 10^2$ MPa at a temperature of about 20° C. below the $T_g$ of the cured adhesive film, and preferably at $T_Q$. The conductive substrates are typically printed circuit boards having conductive bonding sites adapted to be bonded to integrated circuits, flexible circuits, rigid circuits, or the like.

"Reworkable", as used herein, is defined as an adhesive that is entirely removable from the substrate at a temperature of less than about 250° C., preferably less than 200° C. A reworkable adhesive will typically be entirely removable at a temperature of about 10° C. to 30° C. above the $T_g$ of the adhesive. Higher temperatures may be used to further facilitate removal in many instances, but excessively high temperatures may degrade the substrate or conductive devices thereon. Any residue remaining on the substrate can be removed by rubbing with a porous, non-abrasive implement, such as a cotton swab, saturated with a suitable solvent, e.g., methylene chloride, tetrahydrofuran, or acetone. It is preferred that the reworkable adhesive film be removable from a substrate selected from the group consisting of: conductive materials such as copper, gold, silver, aluminum, nickel, and solder; dielectrics such as ceramic, glass, silicon and epoxy/glass laminates; and polymer films such as polyimide and PET, with application of a shear force of less than about 1 MPa.

"Effective amount", as used herein, is defined as an amount of a component, that when blended with the other components, is sufficient to provide a reworkable adhesive, preferably providing an adhesive having a shear strength of less than about 1 MPa at a temperature of about 20° C. above the $T_g$ of the cured adhesive composition, and a modulus of greater than about $1 \times 10^2$ MPa at a temperature of about 20° C. below the $T_g$ of the cured adhesive composition. An adhesive including "an effective amount" of each of its components will preferably be removable with a shear strength of less than about 1 MPa at $T_p$.

"Crosslinkable resin", as used herein, is defined as one or more moieties that react to form a crosslinked network.

"Thermoplastic polymer", as used herein, is defined as a polymeric component that does not react with the crosslinkable resin to an appreciable degree, and the use of the term "reaction product", referring to the cured adhesive composition, is not meant to indicate that there is reaction between thermoplastic polymer and crosslinkable resin.

An effective amount of the epoxy resin including curative, if any, is typically 25 to 80 percent by weight of the total adhesive resins in the adhesive film, and preferably about 40 to 65 percent by weight of the adhesive resins. An effective amount of the cyanate ester resin is typically about 25 to 75 percent by weight of the adhesive resins, and preferably about 40 to 65 percent by weight of the adhesive resins. Adhesive resins refers to the thermoplastic polymer and crosslinkable resin, excluding any solvent, optional fillers, etc. that may be contained in the total adhesive film.

BRIEF DESCRIPTION OF THE DRAWINGS

The invention will be further explained with reference to the drawing, wherein.

DETAILED DESCRIPTION OF ILLUSTRATIVE EMBODIMENTS

Figure 1:
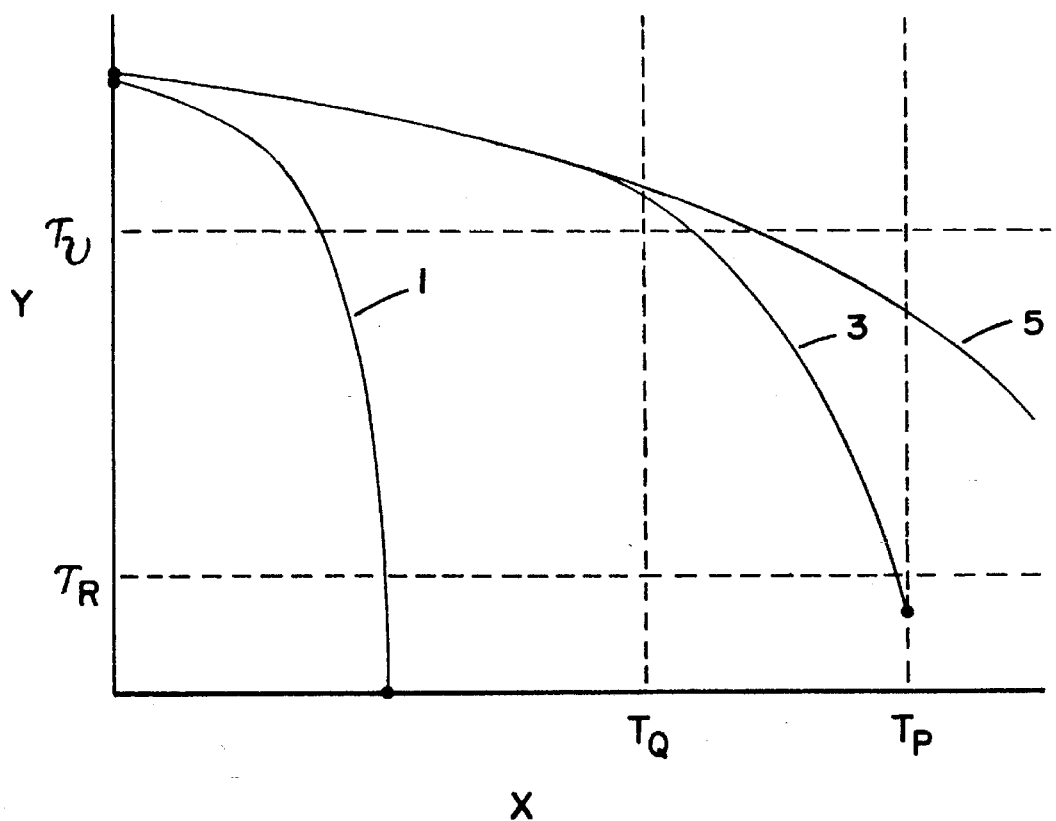
FIG. 1 depicts a plot of temperature (X-axis) versus modulus (Y-axis) for three adhesive compositions including an adhesive composition of the present invention.

"Shear strength" as used herein refers to the force needed to shear a chip off a glass substrate as illustrated in Example 9.

A reworkable adhesive composition of the present invention may be produced by combining an effective amount of a thermoplastic polymer having a $T_g$ of about 30° C. to 250° C., with an effective amount of a crosslinkable resin. Thus, the adhesive film has a sufficiently high shear strength (above $\tau_U$ in FIG. 1) throughout the desired range of use temperatures ($T_Q$ and below in FIG. 1), but demonstrates a sufficiently rapid drop in shear strength above its $T_g$ so that at a processing temperature, $T_p$, the adhesive is reworkable.

The reworkable adhesive film of the present invention is also preferably storage stable for at least one month at room temperature, has a sufficiently low viscosity at the bonding temperature to provide good flow properties, is rapidly bondable at a modest temperature, and, after bonding is not substantially affected by conditions of up to 85° C. at 85 percent relative humidity, or temperatures of up to $T_Q$.

The reworkable adhesive of the present invention is particularly useful in electronic applications. Many types of electronic components include one or more silicon chips. These chips are normally rectangular or square in shape and are of small dimension, e.g., a few millimeters (mm) on a side. Each chip has at least one, and often many, conductive terminals that must be electrically connected to conductive pathways on a substrate in order to complete the desired circuit. The pathways may comprise thin films or strips of metal, e.g., silver, gold, copper, etc., bonded to the substrate, or may consist of strips of an adhesive or ink which is electrically conductive or rendered electrically conductive by the presence of conductive particles therein.

The reworkable adhesive of the present invention is particularly useful as an attachment means in the FDCA bonding method. The FDCA bonding method bonds a bare chip directly to a conductive substrate. Certain chips have bumps (bumped chips) adapted to bridge the adhesive layer and connect directly to the substrate. An unbumped chip is typically bonded using an adhesive having an array of conductive particles that will form conductive pathways between the substrate and the chip. FDCA bonding is discussed in P. B. Hogerton et al., *Investigations Into The Use Of Adhesives For Level-1 Microelectronic Interconnections*, Electronic Packaging Materials Science, Symposia Proceedings, Apr. 24–29, 1989, which is incorporated herein by reference. It has been observed that reworkable adhesive compositions of the invention containing epoxies with fluorene amine curatives as the crosslinkable component have exhibited better environmental performance in FDCA applications than those containing cyanate ester crosslinkable components.

The range of typical commercial bonding temperatures is in the range of $T_p$, about 125° C. to 250° C., and preferably about 150° C. to 200° C. Bonding times can range from a few minutes to a few hours in the use of prior art adhesives. However, for a commercially feasible, mass production assembly of an electronic component, it is preferred that the bonding time be about 5 seconds to 5 minutes, preferably about 5 to 180 seconds.

The reworkable adhesive composition of the present invention is preferably provided as a film that is nontacky or slightly tacky at the intended handling temperature. The advantages of such an adhesive film over a liquid or paste adhesive include ease of handling, accurate alignment of the chip, and the ability to place the exact amount of adhesive onto the chip to be bonded with minimal waste.

Referring to FIG. 1, an illustrative plot of temperature (X-axis) versus shear strength (Y-axis) for three general types of adhesive compositions is shown. Adhesive 1 is a thermoplastic adhesive, Adhesive 5 is a thermoset adhesive, and Adhesive 3 is an adhesive of the present invention. $T_Q$, or the qualifying temperature, represents the upper end of the desired range of use temperatures. For many intended uses there are set or standard qualification temperatures at which adhesives are tested to determine whether they qualify for a given application. Thus, temperatures below $T_Q$, falling within the range of use temperatures, are those temperatures at which the adhesive is expected to be subjected to in use. $T_Q$ is typically about 80° C. to 150° C., more typically about 100° C. to 125° C.

The processing temperature, $T_p$, is the temperature at which the adhesive will be used to bond the chip to a substrate. $T_p$ must be sufficiently low so that the chips or substrates are not damaged during processing, and must be sufficiently high so that the adhesive will adequately bond the chip to the substrate. $T_p$ is typically about 125° C. to 250° C., more typically about 150° C. to 200° C. The reworkable shear strength, $\tau_R$, is the maximum shear strength at which the adhesive is reworkable. Thus, it is desirable that the shear strength of the adhesive at $T_p$ be below $\tau_R$. The use shear strength, $\tau_U$, is the required shear strength for adequate performance of the adhesive in its intended use.

As shown in FIG. 1, Adhesive 5 (thermoset) has a high shear strength through the range of use temperatures, but is not reworkable. The Adhesive 1 (thermoplastic) has a sufficiently low shear strength so that it is reworkable, but does not have a sufficient shear strength throughout the range of use temperatures. Adhesive 3, an adhesive of the present invention, has a shear strength above $\tau_U$ below $T_Q$, and has a shear strength below $\tau_R$ at $T_p$.

Figure 2:
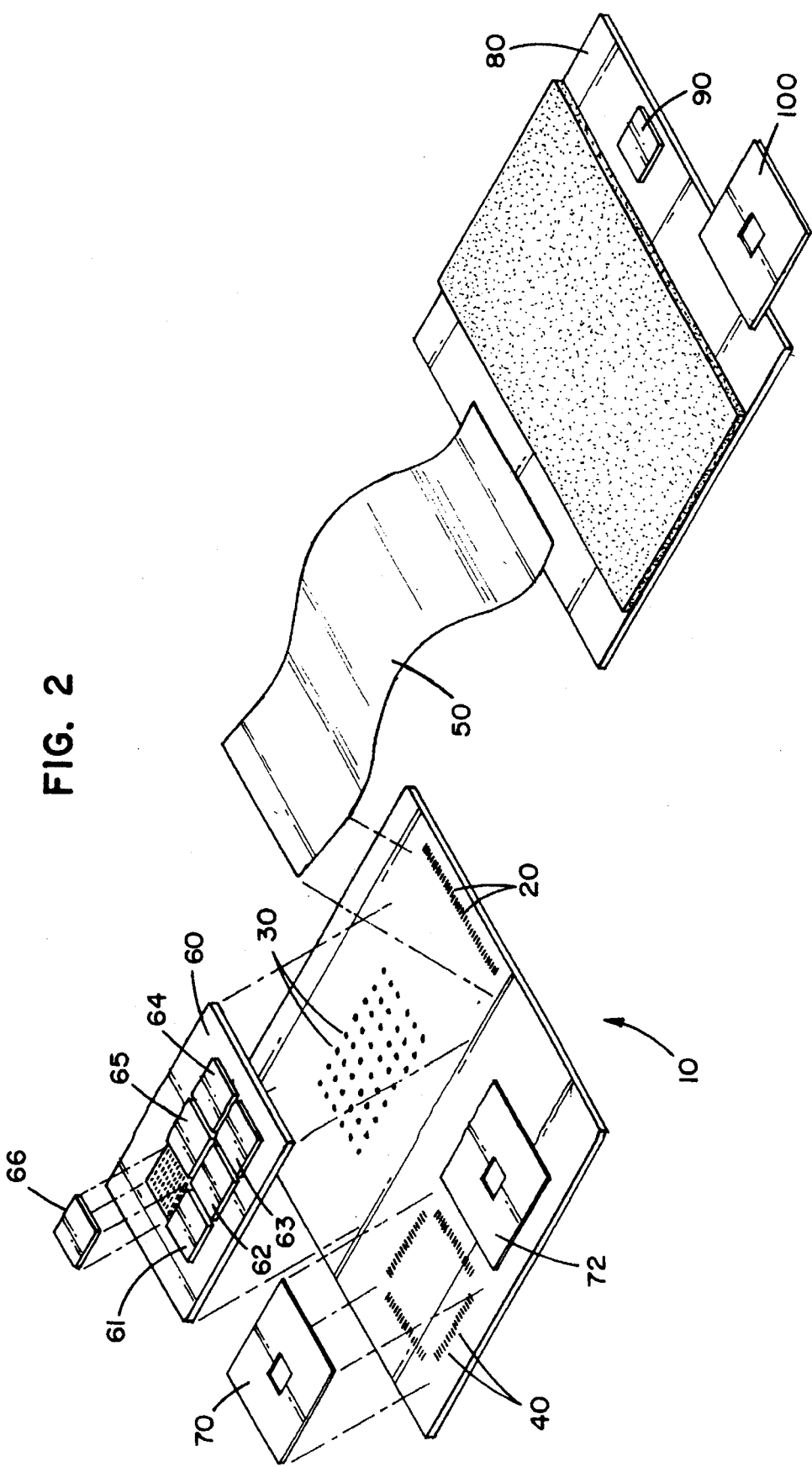
FIG. 2 is a schematic plan view of integrated circuits, printed circuit boards, and the like on which the adhesive composition of the present invention can be used.

FIG. 2 is a schematic plan view of integrated circuits, printed circuit boards, and the like, on which the adhesive composition of the present invention is particularly suitable for use. A printed circuit board 10 is shown having flexible circuit terminals 20, printed circuit board terminals 30, and printed circuit board terminals 40. An adhesive of the present invention may be utilized, for example, to bond flexible circuit 50 to the flexible circuit terminals 20; a printed circuit board 60 to the printed circuit board terminals 30; and a TAB, i.e., tape automated bonding, lead frame 70 to the printed circuit board terminals 40.

A TAB lead frame 72 is shown bonded to the printed circuit board 10. The printed circuit board 60 has flip chips 61–66. Flip chip 66 is shown prior to bonding to the printed circuit board 60. An adhesive of the present invention could be used to bond flip chips 61–66 to printed circuit board 60. Also shown in FIG. 2 is a liquid crystal display 80. The liquid crystal display 80 has the flexible circuit 50 bonded thereto. A flip chip 90 and a TAB lead frame 100 are also shown bonded to the liquid crystal display 80.

Figure 3:
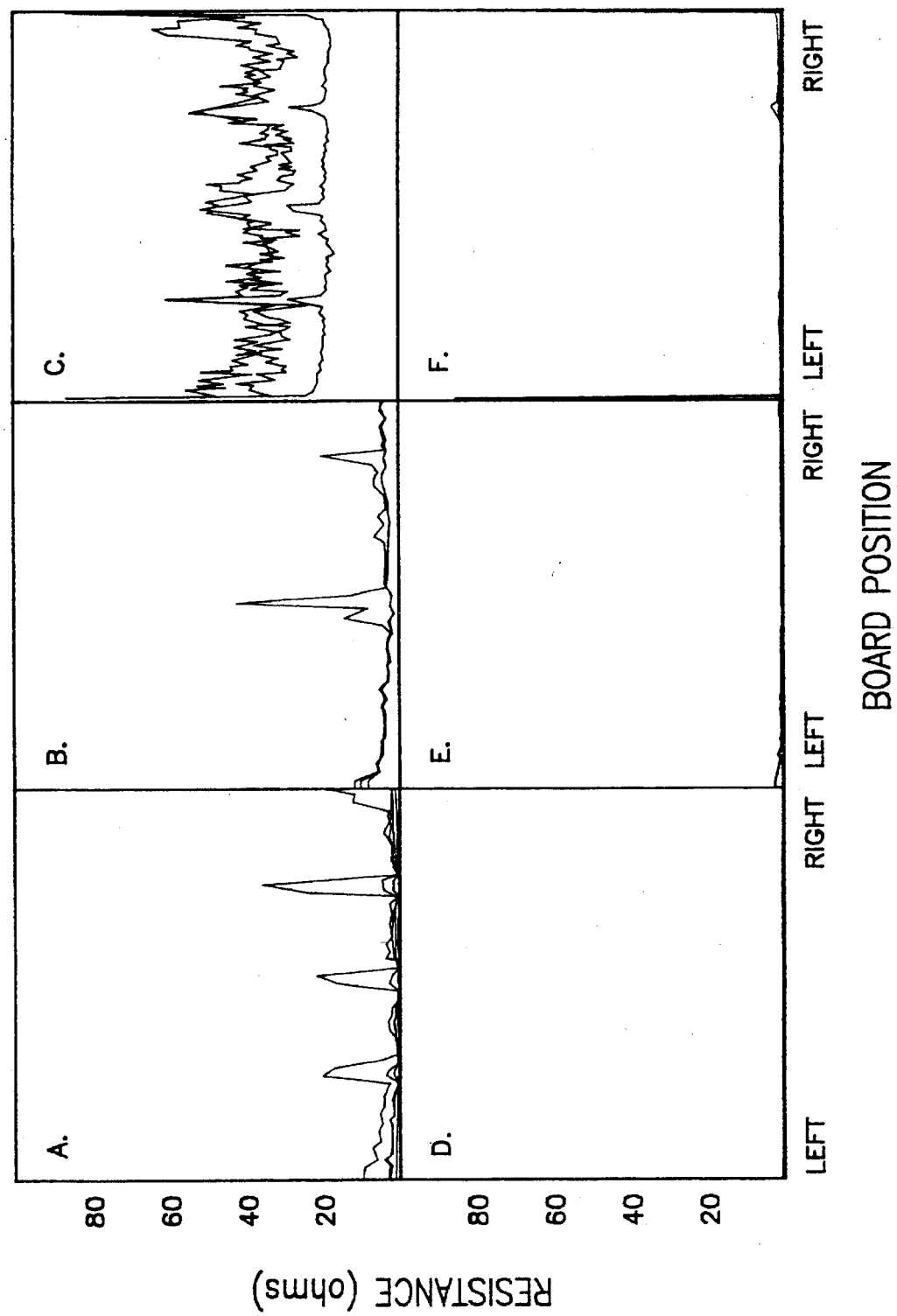
FIG. 3 is a graph depicting thermal cycling for Examples 1–6.

FIG. 3 contains six graphs which illustrate the stability of interconnection resistances throughout 1000 hr exposures to thermal cycling between –55° C. and 125° C. The interconnect pads on all of the test chips were located around the perimeters of the chips, and the graphs depict the distribution of resistances as a function of position about the perimeter. Each line on each graph represents the resistance distribution at a single point in time. Data has been included in each graph representing 0 hr, 150 hr and 1000 hr check points. In some cases, additional data at the 500 hr checkpoint is included as well. Each graph represents a different combination of chip type and substrate described below.

Referring to FIG. 3, Samples A, B and C utilized glass test substrates with Indium-Tin Oxide (ITO) test circuits having a sheet resistance of 20 ohms per square. Samples D, E, and F utilized glass test substrates with nickel test circuits having a sheet resistance of less than 1 ohm per square. Samples A and D utilized test chips (3M120 test chips) with dimensions 6.73×6.73 mm and having 120 gold bumped pads with a center to center spacing of 0.2 mm. Samples B and E were similar to Samples A and D but utilized test chips which had unbumped pads. Samples C and F were similar to samples A and D but utilized test chips (3M328 test chips) with dimensions 8.76×8.76 mm and having 328 gold bumped pads with a center to center spacing of 0.1 mm.

Figure 4:
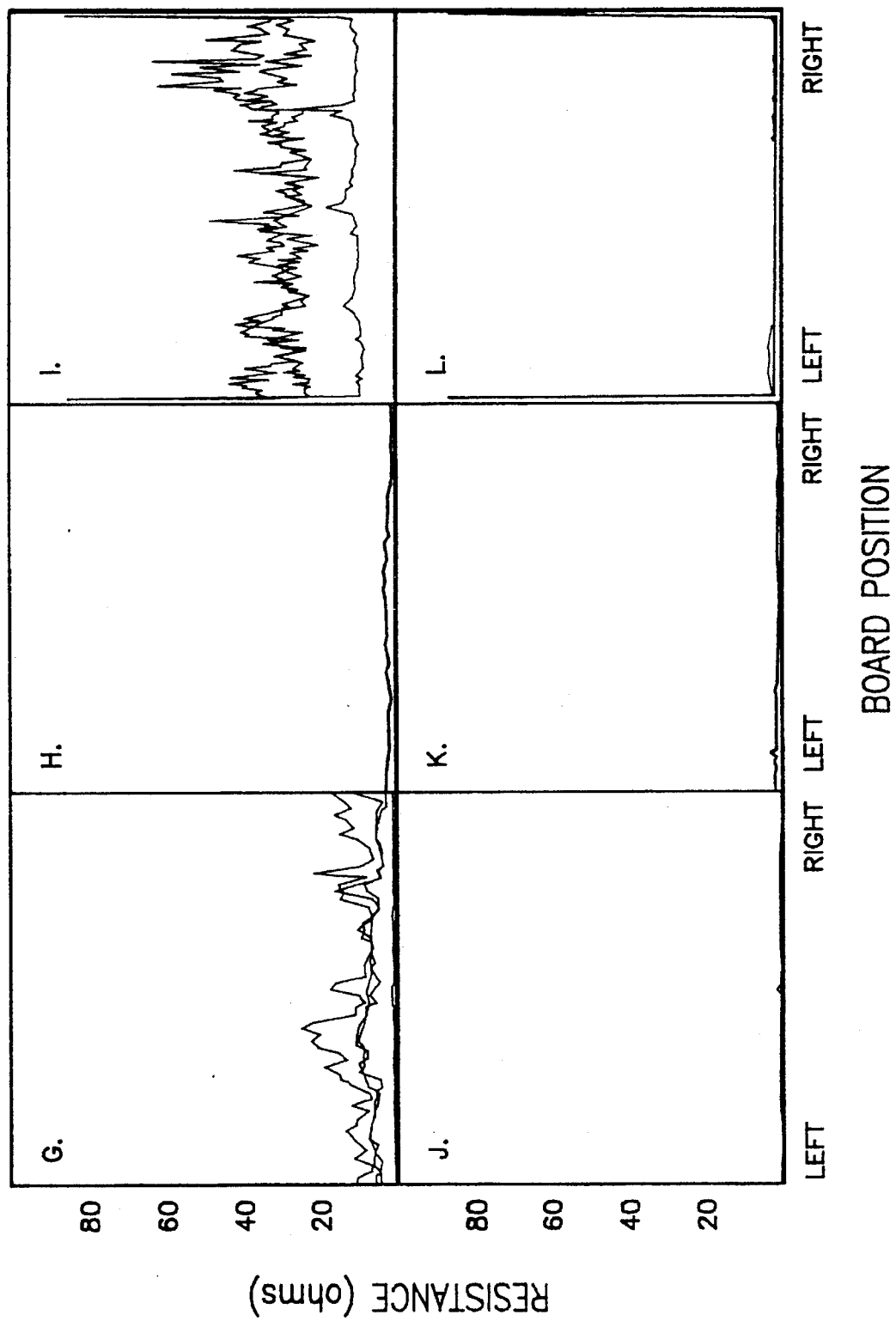
FIG. 4 is a graph depicting thermal aging for Examples 1–6.

Additional environmental aging results for flipped direct chip attachment to glass are shown in FIG. 4. Configurations G–L correspond exactly with configurations A–F from FIG. 3, but were aged at 125° C. for 1000 hrs.

Figure 5:
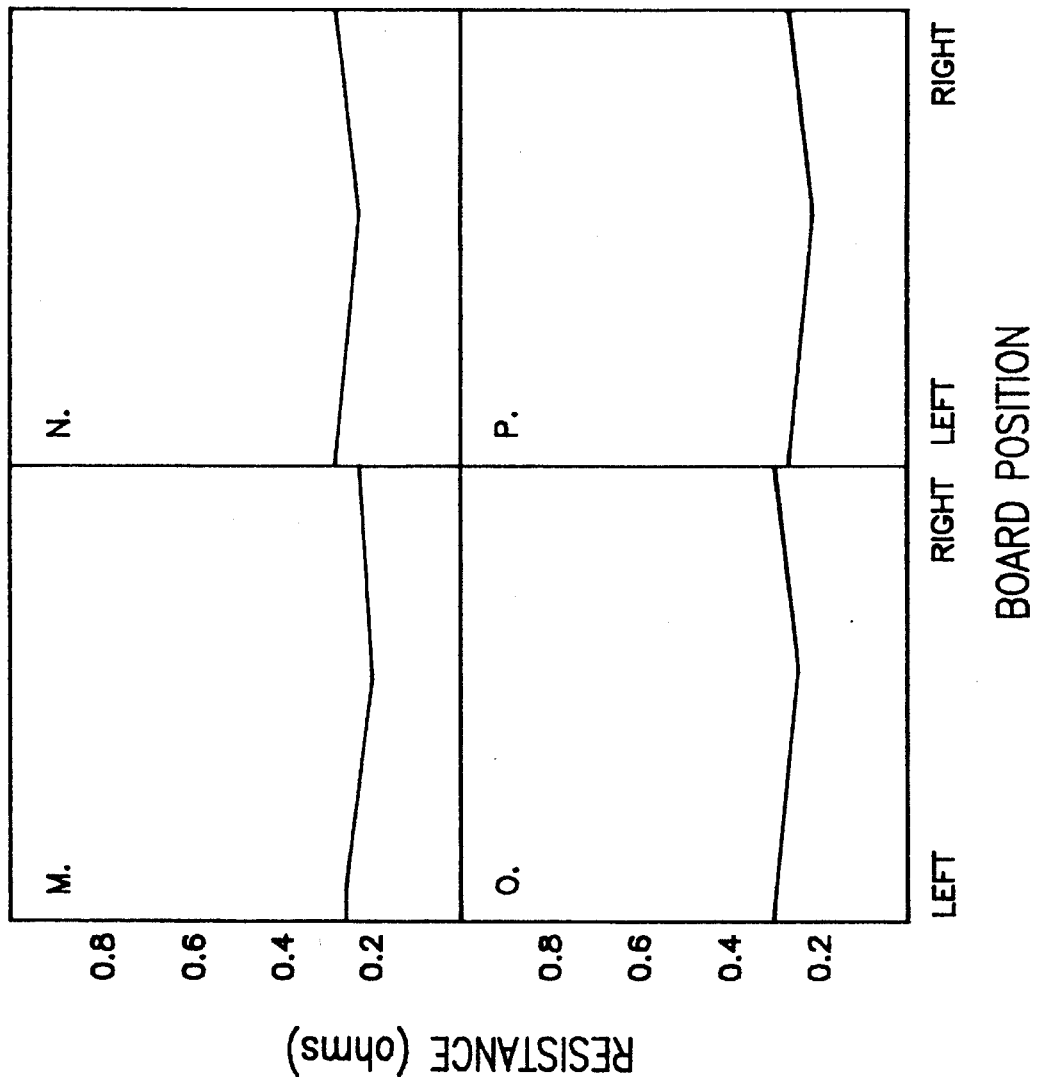
FIG. 5 is a graph depicting the environmental testing of Example 7.

Referring to FIG. 5, a graph depicting environmental testing of Example 7 (samples M–P) is shown. FIG. 5 depicts environmental testing of a flex circuit having 0.4 mm center to center pad spacing bonded to a corresponding circuit board and having failure resistance equal to 10 ohms. Sample M was tested at 85° C. and 85 percent relative humidity. Sample N was tested at 60° C., 95 percent relative humidity and 15 volts. Sample 0 was tested at 125° C. Sample P was tested at –55° C. to 125° C.

Figure 6:
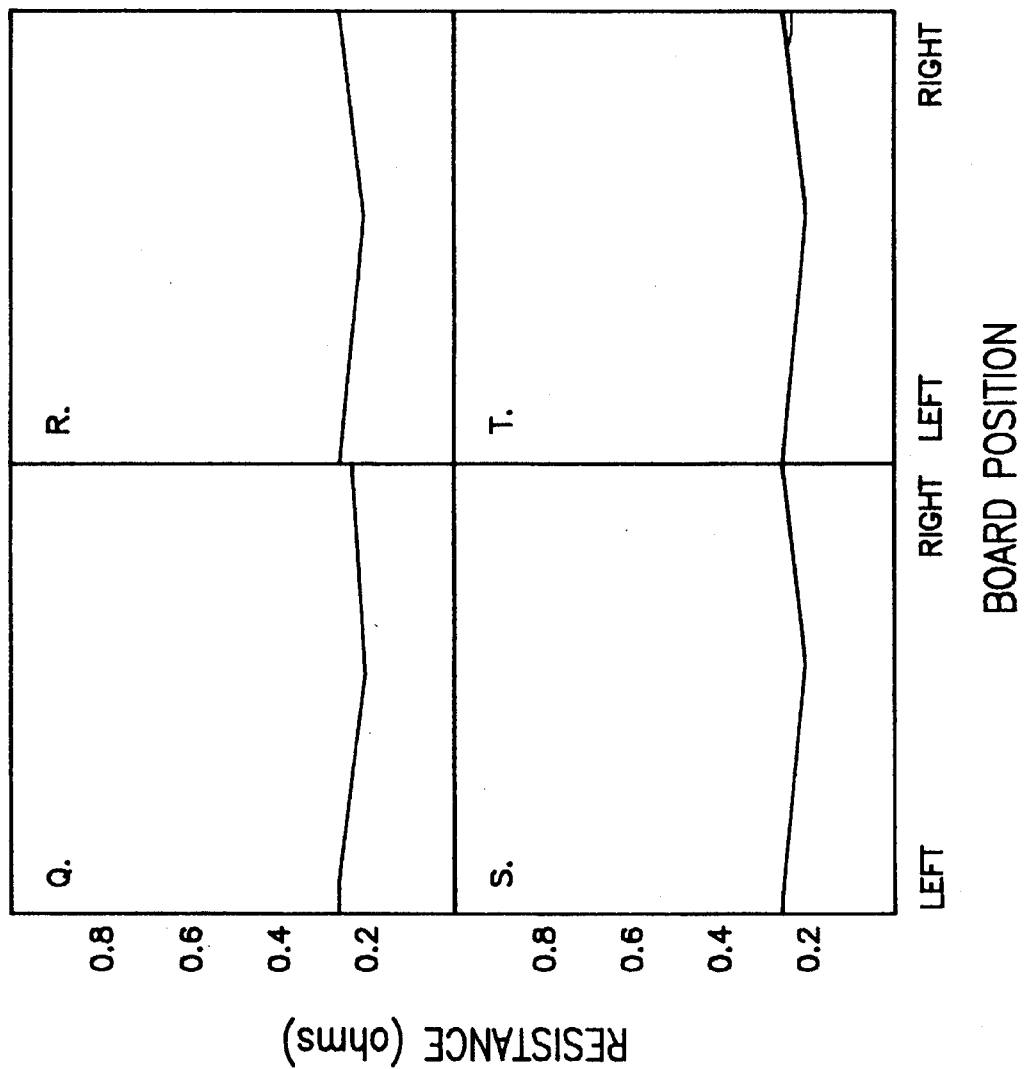
FIG. 6 is a graph depicting the environmental testing of Example 8.

Referring to FIG. 6, a graph depicting the environmental testing of Example 8 (samples Q–T) is shown. The tests depicted in FIG. 6 were conducted in a similar manner to those of FIG. 5.

Thermoplastic Polymer

The adhesive composition of the present invention includes a thermoplastic polymer in an amount sufficient to render the adhesive composition reworkable. The crosslinkable resin provides a crosslinked structure to the adhesive sufficient to provide an adequate modulus and shear strength over the desired range of use temperatures and to prevent creep. The thermoplastic polymer is integrated with the crosslinked polymer to render the total adhesive composition reworkable at $T_p$, the processing temperature.

A thermoplastic polymer or resin is typically present at about 20 to 75 percent by weight.

In FIG. 1, a plot of shear strength versus temperature is provided. The reworkable adhesive of the present invention, Adhesive 3, maintains a sufficiently high shear strength throughout the range of use, but the shear strength drops sharply above the $T_g$ of the adhesive to provide a shear strength of less than about 1 MPa at $T_p$, which may correspond to a temperature of about 20° C. above the $T_g$ of the cured adhesive film. This allows, for example, a bonded chip to be removed from the substrate at $T_p$. Remaining adhesive residue may be removed by rubbing with a porous, non-abrasive implement, such as a cotton swab, that has been saturated with a suitable solvent.

Suitable thermoplastic polymers include polysulfones, polyvinyl acetals, polyamides, polyesters, polyimides, polycarbonates, polyetherimides, and polyvinyls. The use of polysulfones and polyvinyl acetals has proven particularly useful in applications involving FDCA, and are thus preferred.

Suitable polysulfones include those falling within Formula VII below.

except that one of $R^{15}$–$R^{17}$ is —$NH_2$ or —$NHCH_3$, and the remaining two are independently —H, —$CH_3$ as set forth above.

Examples of suitable fluorene epoxy curatives are described in U.S. Pat. No. 4,684,678, and include 9,9-bis(4-aminophenyl)fluorene; 9-(3-methyl-4-aminophenyl)-9-(3'-methyl-4'-methylaminophenyl)fluorene; 9,9-bis(4-methylaminophenyl)fluorene; 9-(4-methylaminophenyl)-9-(4'-aminophenyl)fluorene; 9,9-bis(3-methyl-4-aminophenyl)fluorene; 4-methyl-9,9-bis(4-

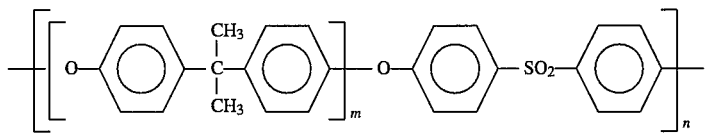

Formula VII wherein m is 0 or 1, and n is 10 to 500. When m is 0, n is preferably about 12–50, and when m is 1, n is preferably about 40–70.

Examples of suitable polysulfones include P1700-NT11, a polysulfone resin from Amoco Performance Products; and Victrex PES 5003P, a polysulfone, commercially available from ICI Advanced Materials.

Suitable polyvinyl acetals include those falling within Formula VIII below.

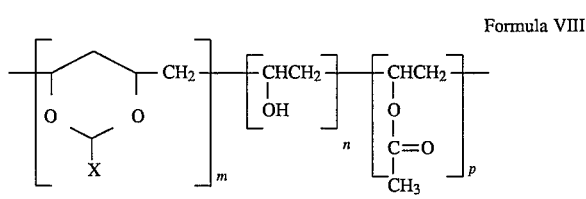

Formula VIII wherein X is —H or a $C_1$–$C_4$ alkyl group, and m is 80 to 2400, n is 10 to 2200, and p is 0 to 500. Preferably m is greater than n, n is greater than p, m is less than 800, and each monomer is randomly distributed.

Examples of suitable polyvinyl acetals include polyvinyl butyrals, such as Sekisui SLEC BX-L.

Polyamides include Unirez 2636, commercially available from Union Camp. Polyesters include Dynapol 206, commercially available from Hü America, Inc. Polycarbonates include GE R3320. Polyvinyls include polystyrene, polyacrylates, and polymethacrylates.

Crosslinkable Resins

The adhesive composition of the present invention also includes an effective amount of a crosslinkable resin. The crosslinkable resin includes one or more moieties that react to form a crosslinked network. Preferred crosslinkable resins include: epoxy resins, comprising one or more epoxy compounds, optionally including an epoxy curative; and cyanate ester resins, comprising one or more cyanate ester compounds. The epoxy resin preferably includes one or more aromatic epoxy compounds. Aromatic epoxies typically provide adhesive compounds having a higher shear strength than do aliphatic epoxies. The epoxy resin will typically be present at about 25 to 80 percent by weight, and it is preferred that the epoxy resin be present at about 40 to 65 percent by weight. An epoxy curative may also be utilized as required, and is considered to be a part of the epoxy resin.

The epoxy resin preferably comprises epoxies according to one or more of the Formulas I, II, and/or III, as set forth above. The epoxy curative preferably falls under Formula III methylaminophenyl)fluorene; 9,9-bis(3,5-dimethyl-4-aminophenyl)fluorene; and 9-(3,5-dimethyl-4-methylaminophenyl)-9(3',5'dimethyl-4'aminophenyl)-fluorene.

Examples of suitable epoxy resins include 2,2-bis[4-(2,3-oxypropoxy)phenyl] propane and 4,4'-bis(2,3-oxypropoxy)biphenyl. Specific examples include QUATREX 1010, from Dow Chemical, and ARATRONIC 5046, from Ciba Geigy. Also, epoxy novolac resins in which $R^7$, $R^9$, and $R^{11}$ are —H, and $R^8$, $R^{10}$, and $R^{12}$ are the Epoxy Groups (Formula II); and cresole epoxy novolac resins, in which $R^7$, $R^9$, and $R^{11}$ are —$CH_3$. In general, it is preferred that k be 1 and m be 1–3 (Formula II). Examples of epoxy resins falling under Formula III are disclosed in U.S. Pat. No. 4,707,534, incorporated herein by reference.

Another suitable and preferred class of crosslinkable resins are cyanate esters. Examples of suitable cyanate esters include those having Formulas IV, V, and VI, with cyanate esters of Formulas IV and V preferred. It is preferred that the cyanate ester is present at about 25 to 75 percent by weight, more preferably about 40 to 65 percent by weight.

More generally than those cyanate ester resins falling within Formulas IV, V, and VI, cyanate ester monomers suitable for use in the present invention are described in copending application, U.S. Ser. No. 234,464, filed Aug. 19, 1988, incorporated herein by reference. These cyanate esters contain 2 or more —OCN groups, and are of the general formula:

 Formula IX wherein p can be an integer from 2 to 7, and wherein Q comprises at least one of: 1) a mono-, di-, tri-, or tetrasubstituted aromatic hydrocarbon containing 5 to 30 carbon atoms; 2) 1 to 5 aliphatic or polycyclic aliphatic mono-, di-, tri-, or tetrasubstituted hydrocarbons containing 7 to 20 carbon atoms; and 3) 1 to 10 heteroatoms selected from the group consisting of non-peroxidic oxygen, sulfur, non-phosphino phosphorus, non-amino nitrogen, halogen, and silicon.

In the practice of this invention, a combination of cyanate ester monomers can be used whereby such combination is comprised of one or more cyanates of Formula IX and oligomers thereof, where p is 2 to 7.

Examples of cyanates are as follows: 1,3- and 1,4-dicyanatobenzene; 2-tert-butyl- 1,4-dicyanatobenzene; 2,4-dimethyl-1,3-dicyanatobenzene; 2,5-di-tert-butyl-1,4-dicyanatobenzene; tetramethyl-1,4-dicyanatobenzene; 4-chloro-1,3-dicyanatobenzene; 1,3,5-tricyanatobenzene; 2,2'- or 4,4'-dicyanatobiphenyl; 3,3',5,5'-tetramethyl-4,4'- dicyanatobiphenyl; 1,3-, 1,4-, 1,5-, 1,6-, 1,8-, 2,6-, or 2,7-dicyanatonaphthalene; 1,3,6-tricyanatonaphthalene; bis(4-cyanatophenyl)methane; bis(3-chloro-4-cyanatophenyl)methane; 2,2-bis(4-cyanatophenyl)propane; 2,2-bis(3,5-dibromo-4-cyanatophenyl)propane; 2,2-bis(4-cyanatophenyl)-1,1,1,3,3,3-hexafluoropropane; bis(4-cyanatophenyl) ether, bis(4-cyanatophenoxyphenoxy)benzene; bis(4-cyanatophenyl)ketone; bis(4-cyanatophenyl)thioether; bis(4-cyanatophenyl)sulfone; tris(4-cyanatophenyl)phosphite; and tris(4-cyanatophenyl)phosphate.

Also useful are cyanic acid esters derived from phenolic resins (e.g., disclosed in U.S. Pat. No. 3,962,184), cyanated novolac resins derived from novolac (U.S. Pat. No. 4,022,755), cyanated bisphenol-type polycarbonate oligomers derived from bisphenol-type polycarbonate oligomers (U.S. Pat. No. 4,026,913), cyanato-terminated polyaryleneethers (U.S. Pat. No. 3,595,000), dicyanate esters free of ortho hydrogen atoms (U.S. Pat. No. 4,740,584), mixtures of di-and tricyanates (U.S. Pat. No. 4,709,008), polyaromatic cyanates containing polycyclic aliphatic groups such as QUATREX™ 7187 from Dow Chemical Co. (U.S. Pat. No. 4,528,366), fluorocarbon cyanates (U.S. Pat. No. 3,733,349), and other novel cyanate compositions (U.S. Pat. Nos. 4,195,132 and 4,116,946), all of which are incorporated herein by reference.

Polycyanate compounds obtained by reacting a phenol-formaldehyde precondensate with a halogenated cyanide are also useful.

Examples of preferred cyanate ester compositions include low molecular weight oligomers (M.W. about 250–1200) of bisphenol A dicyanates such as AROCY B-30 Cyanate Ester Semisolid Resin commercially available from Hi-Tek Polymers, Jeffersontown, Ky.; low molecular weight oligomers of tetra o-methyl bisphenol F dicyanates, such as AROCY M-30 Cyanate Ester Semisolid Resin, commercially available from Hi-Tek Polymers; low molecular weight oligomers of thiodiphenol dicyanates, such as AROCY T-30 Cyanate Ester Semisolid Resin, commercially available from Hi-Tek Polymers; and low molecular weight oligomers of fluorinated bisphenol A dicyanates such as AROCY F-40S Cyanate Ester Resin Solution commercially available from Hi-Tek Polymers.

Catalysts and Curatives

The use of a suitable catalyst is often preferred to provide reaction of the crosslinkable resin in a satisfactorily short length of time. A catalyst and/or curative can be selected by one of ordinary skill in the art for the reaction of the particular component or components of the crosslinkable resin.

For example, suitable catalysts and curatives for reaction of epoxy resins are well known in the art. Examples of suitable curatives include aliphatic and aromatic primary or secondary amines as, for example bis(4-aminophenyl)sulfone, bis(4-aminophenyl)ether, and 2,2-bis(4aminophenyl)propane; and aliphatic and aromatic tertiary amines, such as dimethylaminopropylamine and pyridine. Examples of suitable catalysts include: boron trifluoride complexes, such as $BF_3$-diethylether and $BF_3$-monoethanolamine; imidazoles, such as 2-ethyl-4-methylimidazole; hydrazides, such as adipodihydrazide; guanidines, such as tetramethyl guanidine; and dicyandiamide.

Also useful as catalysts or supplementary catalysts are Lewis acids such as aluminum chloride, aluminum bromide, boron trifluoride, antimony pentafluoride, phosphorous pentafluoride, titanium tetrafluoride and the like. It is also desirable at times that these Lewis acids be blocked to increase the latency of compositions containing them. Representative of blocked Lewis acids are $BF_3$-monoethylamine and the adduct of $HSbF_5X$ in which X is OH, a halogen, or $OR^{29}$ in which $R^{29}$ is an aliphatic or aromatic group with aniline or a hindered amine, as is described in U.S. Pat. No. 4,503,211.

Additional catalysts include the imidazole-based catalysts described in U.S. Pat. No. 4,331,582, incorporated herein by reference, such as imidazole, 2-methylimidazole; 2-ethyl-4-methylimidazole; 2-phenylimidazole; 1-benzyl-2-methylimidazole; 2-phenyl-4,5-dihydroxymethylimidazole; 2-phenyl-4-methylimidazole; 1-cyanoethyl-2-methylimidazole; 1-cyanoethyl-2-phenylimidazole.

Catalysts specific for the amine curative to epoxy reaction are described in U.S. Pat. No. 4,331,582, incorporated herein by reference. This patent describes the use of a half-salt of a strong aromatic sulfonic acid such as toluenesulfonic acid and an imidazole, preferably an alkylated imidazole such as 2-ethyl- 4-methylimidazole. In addition to the aromatic sulfonic acids mentioned in the patent, methanesulfonic acids such as trifluoromethanesulfonic acid can be used.

Catalysts for the reaction of the cyanate ester include organometallic compounds containing a cyclopentadienyl group, $C_5H_5$ and suitable derivatives, such as cyclopentadienyl iron dicarbonyl dimer $[C_5H_5 Fe(CO)_2]_2$, pentamethylcyclopentadienyl iron dicarbonyl dimer $[C_5(CH_3)_5Fe(CO)_2]_2$ and methylcyclopentadienyl manganese tricarbonyl $C_5H_4CH_3Mn(CO)_3$ which are available from Strem Chemical Company (Newburyport, Mass). Other organometallic compounds which are suitable catalysts for use in the present invention are described in copending application, U.S. Ser. No. 234,464, filed Aug. 19, 1988, U.S. Pat. No. 5,215,860, incorporated herein by reference.

Coupling Agents

The adhesive composition of the present invention may also include a coupling agent to aid in adhesion of the adhesive to a given substrate.

A silane coupling agent is preferred, and is preferably provided in an amount of about 0.1 to 5 percent by weight of the composition, more preferably about 1 percent by weight. A silane coupling agent should include a silane group at one end of the molecule and a group reactive with the crosslinkable resin at the other end.

Preferred silane coupling agents have the formula:

in which:

P represents an organic substituent of up to 12 carbon atoms; e.g., propyl, which should possess functional substituents such as mercapto, epoxy, glycidoxy, acrylyl, methacrylyl and amino;

Z represents a hydrolyzable group, e.g., alkoxy, preferably methoxy or ethoxy, and n is 1, 2, or 3, preferably 3.

In addition to silane coupling agents, titanate and zirconate coupling agents may be utilized. The chapter on coupling agents by J. Cromyn in *Structural Adhesives* edited by A. J. Kinloch, published by Elsevier Applied Science Publishers, 1986, pp 269–312, is incorporated herein by reference. Page 270 provides examples of epoxy and amine silane coupling agents. Pages 306–308 discuss the use of titanate and zirconate coupling agents.

Additional Additives

Conductive particles, including, for example, those described in U.S. Pat. No. 4,606,962 (Reylek et al.), may be added to the adhesive composition as desired. Reylek describes electrically and thermally conductive particles that at the bonding temperature of the adhesive are at least as deformable as are substantially pure silver spherical particles. The thickness of the particles exceeds the thickness of the adhesive between the particles. The particles described in Reylek are preferably substantially spherical and made of a metal such as silver or gold, or of more than one material, such as "a solder surface layer and either a higher melting metal core such as copper or a non-metallic core" (column 4, lines 20–21). These and other conductive particles (e.g., non-spherical and/or having a thickness of less than the thickness of the adhesive) are suitable for use in the adhesive composition of the present invention. Conductive particles contained in adhesive compositions of the invention may be randomly dispersed therein or may be arranged in a uniform array of desired configuration.

Other fillers can be added to the adhesive composition. The use of a filler can provide benefits of increased adhesion, higher modulus, and decreased coefficient of thermal expansion. Useful fillers include, but are not limited to, the following: silica particles, silicate particles, quartz particles, ceramics particles, glass bubbles, inert fibers, and mica particles. Preferably, the filler is microcrystalline silica particles.

It is important that the adhesive composition have a low ionic impurity level. The electronics industry specifies low extractable ion content of the adhesives. Specifications include $Cl^-$, $Na^+$, $K^+$, and $NH_4^+$ of less than 10 parts per million by weight (ppm). Such extremely low ionic contents are important to prevent corrosion of the metals and to keep the conductivity of the adhesive as low as possible except through any conductive metal particles present.

EXAMPLES

The invention will be further explained by the following illustrative examples which are intended to be nonlimiting. All amounts are expressed in parts by weight unless otherwise indicated.

Examples 1–6

An adhesive composition of the present invention was made by mixing together 93 parts of P1700-NT11, a polysulfone resin from Amoco Performance Products (hereinafter PSU), 55 parts of QUATREX 1010, an electronic grade diglycidyl ether of bisphenol A resin from the Dow Chemical Company, (hereinafter Q1010), and 38 parts of 9,9-bis(3-methyl-4-aminophenyl)fluorene (hereinafter BAFOT). These three constituents were stirred to a uniform paste, using 180 parts of methylene chloride as a solvent for the solution of the PSU and Q1010 resins, followed by blending in the relatively insoluble BAFOT. The BAFOT had been jet-milled to a mean particle size of less than about 5 microns (μm). To this dispersion, 4 parts of an accelerator, the trifluoromethanesulfonic acid half salt of 2-ethyl-4-methylimidazole (hereinafter 2E4MI ½T), and 1.88 parts of a silane coupling agent, (3-glycidoxypropyl)trimethoxysilane (hereinafter 3-GPMS), were added. The epoxy adhesive system was coated onto polyester film using a knife coater set at 51 μm and dried overnight at room temperature to give a dry film 20 μm thick.

The active face of a chip was bonded to a glass substrate using the following method. A piece of the dry adhesive film was placed backing side down on a hotplate set at 120° C. and a bumped silicon test chip, having a 0.2 mm (3M120 test chip) or 0.1 mm (3M328 test chip) center to center spacing between the leads, was placed on the adhesive with the active side of the chip contacting the adhesive. Gentle pressure was applied to the chip to insure proper tacking of the adhesive. The adhesive and chip were removed from the hotplate and allowed to cool. The adhesive was scored around the perimeter of the chip and the backing was removed along with the excess adhesive, leaving the active face of the chip completely covered with adhesive. The chip was checked to be sure that the bumps had pierced through the adhesive. The chip was bonded to a glass test substrate having ITO or nickel leads. The bonding was accomplished at 180° C. with a bonding time of 3 minutes. For each 3M120 bumped test chip a bonding force equivalent to approximately 375 grams (g) per bump was applied, and for each 3M328 bumped chip a bonding force equivalent to 82 g per bump was applied. These bonding forces corresponded to a compressive stress of approximately 345 MPa applied to each bump. The chip was removed from the glass by shearing the chip at 180° C. and the remaining adhesive was removed from the glass by rubbing a cotton swab soaked in methylene chloride over the glass. A fresh chip was bonded to the glass and excellent interconnection was again achieved.

Samples were also made by bonding unbumped 3M120 chips with adhesive having 20 μm Bell Pearl (nickel coated phenoxy resin) conductive particles embossed into the adhesive in places corresponding to the pads on the chip and substrate. Bonding was accomplished in the same manner as described above except that an applied force of 225 g per pad was used. This bonding force corresponded to a compressive stress of approximately 210 MPa applied to each pad.

Environmental aging tests were performed on samples prepared and bonded in the manner described above. The bonded samples were tested by subjecting a sample to humidity aging at 85° C. at 85 percent relative humidity, a sample to thermal aging at 125° C., and a sample to thermal cycling from −55° C. to 125° C. Each test was run for 1000 hours. The results are summarized Table 1.

TABLE 1

| Ex. | Leads | Pad Spacing | Chip | 85° C./85% RH | −55 to 125° C. | 125° C. |
| --- | --- | --- | --- | --- | --- | --- |
| 1 | ITO | 0.2 mm | bumped | pass | pass | pass |
| 2 | ITO | 0.2 mm | unbumped | failed | pass | pass |
| 3 | ITO | 0.1 mm | bumped | pass | pass | pass |
| 4 | Ni | 0.2 mm | bumped | Ni corrosion | pass | pass |
| 5 | Ni | 0.2 mm | unbumped | Ni corrosion | pass | pass |
| 6 | Ni | 0.1 mm | bumped | Ni corrosion | pass | pass |

To pass the test interconnections must have been maintained for the duration of the test. The failure shown for Example 2 at 85° C./85 percent relative humidity may have been caused by a contamination of the deionized water supply. The nickel corrosion shown in the table was not caused by the adhesive. The corrosion occurred outside of the area covered by adhesive and was caused by the humidity in the chamber. FIGS. 3 and 4 show graphs of the thermal cycling (samples A–F) and thermal aging (samples G–L), respectively, for Examples 1–6.

Example 7

An adhesive composition of the present invention was made by adding 20.6 parts of FINEPEARL™ (gold on nickel on polystyrene having an average diameter of 6 μm, from Sumitomo Chemical, Osaka, Japan) conductive particles to the adhesive formulation of Examples 1–6 by dispersing the particles in the adhesive mixture before the adhesive was knife-coated. The adhesive with particles was coated onto a polyester film using a knife coater set at 76 μm and dried overnight at room temperature to give a dry film 30 μm thick. The adhesive was used to bond a polyimide flexible printed circuit (FPC) to a FR4 printed circuit board. The FPC comprises a 50 μm polyimide backing having 17 stripes with a spacing of 0.4 mm center to center and made of 1 ounce copper coated with 13 μm solder. The printed circuit board comprises 1 ounce copper stripes coated with 13 μm solder with 0.4 mm center to center spacing on a FR4 laminate board. Before bonding, a piece of adhesive with backing was cut to measure 3.2 mm by 7.9 mm.

The adhesive was pretacked to the FPC by heating the FPC to 110° C. and pressing the adhesive strip with the backing side up onto the FPC across the stripes using slight pressure. After cooling the backing was peeled off. The FPC was placed on the printed circuit board with the adhesive facing the board. The stripes on the FPC were aligned with the stripes on the board. Bonding was accomplished using a Scotchlink bonder having a 3.2 mm bare steel bar set at 217° C. and bonding for 3 minutes under 1.7 to 2.1 MPa. The FPC could be removed from the circuit board by heating the board and pulling off the FPC. Both the FPC and the board could be cleaned using methylene chloride and reused. Samples bonded in the manner described above passed 1000 hours of environmental aging at 60° C./95 percent relative humidity aging, 60° C./95 percent relative humidity/15 V biased humidity aging, 85° C./85 percent relative humidity aging, −55° to 125° C. thermal cycling, −40° C. to 105° C. thermal cycling, 100° C. thermal aging, and 125° C. thermal aging. To pass the test interconnection resistance could not exceed 1 ohm at the end of the test. FIG. 5 shows graphs of the four most rigorous of these tests (samples M–P).

Example 8

An adhesive composition of the present invention was made by dissolving 20 parts of PSU in 10 parts of tetrahydrofuran (hereinafter THF). To this solution, 20 parts of 9,9-bis[4-(2,3-epoxypropoxy)phenyl]fluorene (FEP) were added with stirring until the FEP dissolved. More THF was added as needed to dissolve the FEP. After all of the FEP was dissolved, the solution was stirred uncovered until enough THF had evaporated to give a solution with a viscosity suitable for making a film. At this point a solution of 1 part of 2-methylimidazole (hereinafter 2 MZ) dissolved in a minimum of THF and 0.48 part of 3-GPMS were stirred into the PSU and FEP mixture. After 4.56 parts of FINE-PEARL™ conductive particles were added, the mixture was stirred to a uniform dispersion and knife-coated onto polyester film using a gap of 102 μm. The film was allowed to dry overnight at room temperature to give a dry film 30 μm thick. The adhesive was bonded as in the previous example except that the bonder was set at 237° C. and the bonding time was 30 seconds. As above, the FPC was removed from the circuit board by heating the board and pulling off the FPC. Both the FPC and the board could be cleaned using methylene chloride and reused. Samples bonded in the manner described above passed all of the environmental tests described in Example 7 with all of the resistances under 1 ohm. FIG. 6 shows graphs of the four most rigorous of these tests (samples Q–T).

Example 9

Reworkability depends on the amount of thermoplastic in the formulation. When the adhesive from Example 1 was made with varying amounts of PSU and used to bond a bumped 3M120 test chip to a glass substrate using the bonding conditions of Example 1, the reworkability was tested by measuring the force needed to shear the bond, with solvents used to remove the remaining adhesive from the glass. When 39 parts of PSU were used, 1.8 MPa of force were needed to shear the chip from the substrate at 230° C., and the adhesive residue could not be removed with solvent. When 55.8 parts of PSU were used, the bond could be sheared at 180° C. using 2.1 MPa of force, but not all of the adhesive could be removed with solvent. When 74.4 parts of PSU were used, 0.81 MPa of force were needed to shear the bond at 185° C., and all of the adhesive was removed by scrubbing with a swab saturated with methylene chloride. When 93 parts of PSU were used as in Example 1, 0.22 MPa of force was needed to remove the chip, and all of the adhesive was removed by scrubbing with a swab saturated with methylene chloride. Thus, in this embodiment more than 55.8 parts of PSU are needed for reworkability.

Example 10

The influence of bonding time on reworkability was examined. Samples of the adhesive used in Example 1 were tacked to glass slides and placed in an oven at 180° C. for 3, 4 and 5 minutes. After cooling, the slides were placed in beakers of methylene chloride. The sample cured for 3 minutes dissolved rapidly. The sample cured for 4 minutes appeared to dissolve somewhat, but not completely. When tweezers were used to pull the film off the slide, the film curled into a ball. After 3 hours the adhesive had not dissolved. The sample cured for 5 minutes did not dissolve and could be peeled off the slide in one piece. After 3 hours the adhesive film had not dissolved. When bonds were made as before, except with 4 and 5 minute bonding times, the bonds could be sheared at 180° C. with less than 0.22 MPa of force for the 4 minute bond, and less than 0.33 MPa for the 5 minute bonds. The adhesive could be removed from the glass substrates and the chips by scrubbing with a cotton swab saturated with methylene chloride.

Example 11

An adhesive of the present invention was prepared by mixing the following components:

| Component | Parts |
|---|---|
| polyvinyl butyral, S-LEC BX-L, Sekisui Chemical Company | 13.32 |
| cyanate ester, AROCY B-30, Hi-Tek Polymers | 13.32 |
| cyclopentadienyl iron dicarbonyl dimer | 0.05 |
| 3-GPMS | 0.30 |
| FINEPEARL ™ | 3.00 |
| THF | 70.01 |

The polyvinyl butyral and the cyanate ester were dissolved in the THF. The 3-GPMS, the cyclopentadienyl iron dicarbonyl dimer catalyst, and the conductive particles were added and mixed into the solution. The adhesive composition was cast onto the polyester film using a knife coater to provide a dry film thickness of 35 μm. The polyester film had a silicone release coating to facilitate the release of the adhesive. The adhesive film was dried at room temperature for about 24 hours. The adhesive was bonded as in example 7 except that the bonding time was 2 minutes. As in example 7, the FPC was removed from the circuit board, and both the FPC and the board could be cleaned and reused. Bonded samples were subjected to the same environmental testing as done in example 7 with all samples passing the tests and having resistances under 0.3 ohm.

Various modifications and alterations of this invention will become apparent to those skilled in the an without departing from the scope and spirit of this invention.

We claim:

1. An adhesive composition comprising:
   (a) an amount sufficient to provide a reworkable adhesive when blended with other components of a thermoplastic polymer having a $T_g$ of 30° C. to 250° C., said thermoplastic polymer selected from the group consisting of: polysulfones, polyimides, polycarbonates, and polyethers;
   (b) an amount sufficient to provide a reworkable adhesive when blended with other components of a crosslinkable resin having a $T_g$ of 125° C. to 300° C.;
   (c) a catalyst capable of accelerating the cure reaction of said crosslinkable resin;
   wherein said adhesive composition has a cure time of from 5 to 300 seconds, at a temperature of from 125° C. to 250° C., and when cured, said adhesive composition is a reworkable adhesive having a $T_g$ of 100° C. to 200° C., and having a shear strength of less than 1 MPa at a temperature of 20° C. above the $T_g$ of said reworkable adhesive, and a modulus of greater than 100 MPa at a temperature of 20° C. below the $T_g$ of the cured reworkable adhesive.

2. The adhesive composition of claim 1 wherein said reworkable adhesive has a shear strength of less than about 0.5 MPa at a temperature of about 20° C. above the $T_g$ of the cured reworkable adhesive.

3. The adhesive composition of claim 2 wherein said reworkable adhesive film has a modulus of greater than $1 \times 10^3$ MPa at a temperature of about 20° C. below the $T_g$ of the cured adhesive composition.

4. The adhesive composition of claim 1 wherein said thermoplastic polymer is a polysulfone that falls within the following general formula:

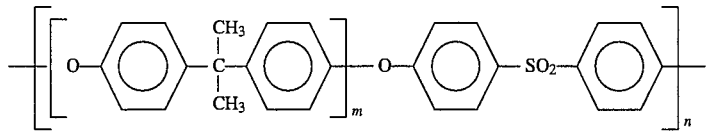

wherein m is 0 or 1, n is 10–500.

5. The adhesive composition of claim 1 wherein said crosslinkable resin is an aromatic epoxy compound, said epoxy resin is present at about 25 to 80 percent by weight of total adhesive resin.

6. The adhesive composition of claim 5 wherein said epoxy resin is present at about 40 to 65 percent by weight of total adhesive resin.

7. An adhesive composition comprising:
   a) an amount sufficient to provide a reworkable adhesive when blended with other components of a thermoplastic polymer having a $T_g$ of 30° C. to 250° C., said thermoplastic polymer selected from the group consisting of: polysulfones, polyimides, polycarbonates, and polyethers;
   b) an amount effective to provide a reworkable adhesive when blended with other components of a crosslinkable resin having a $T_g$ of 125° C. to 300° C.;
   c) a catalyst capable of accelerating the cure reaction of said crosslinkable resin;
   wherein said adhesive composition has a cure time of from 5 to 300 seconds, at a temperature of from 125° C. to 250° C., and when cured, said adhesive composition is a reworkable adhesive having a shear strength of less than about 1 MPa at a processing temperature, $T_p$, in the range of about 125° C. to 250° C., and a modulus of greater than 100 MPa at a qualifying temperature, $T_Q$, in the range of about 80° C. to 150° C., wherein $T_Q$ is less than $T_p$.

8. The adhesive composition of claim 7 wherein $T_p$ is about 150° C. to 200° C.

9. The adhesive composition of claim 7 wherein $T_Q$ is about 100° C. to 125° C.

10. The adhesive composition of claim 7 wherein said crosslinkable resin is an aromatic epoxy compound.

* * * * *

UNITED STATES PATENT AND TRADEMARK OFFICE
CERTIFICATE OF CORRECTION

PATENT NO.   :   5,457,149

DATED        :   Oct. 10, 1995

INVENTOR(S)  :   Hall et al.

It is certified that error appears in the above-identified patent and that said Letters Patent is hereby corrected as shown below:

Column 4, line 10, delete "$1 \times 10^2$" and insert therefore --$1 \times 10^3$--.

Column 11, line 46, delete "Hü" and insert therefor --Hüls--.

Column 20, line 30, delete "0".

Signed and Sealed this

Twelfth Day of March, 1996

Attest:

BRUCE LEHMAN

Attesting Officer      Commissioner of Patents and Trademarks